(12) United States Patent
Wu (10) Patent No.: US 12,215,018 B2
(45) Date of Patent: Feb. 4, 2025

(54) METHOD FOR MANUFACTURING PACKAGE STRUCTURE

(71) Applicant: Winbond Electronics Corp., Taichung (TW)

(72) Inventor: Jin-Neng Wu, Tainan (TW)

(73) Assignee: WINBOND ELECTRONICS CORP., Taichung (TW)

(*) Notice: Subject to any disclaimer, the term of this patent is extended or adjusted under 35 U.S.C. 154(b) by 0 days.

(21) Appl. No.: 18/609,571

(22) Filed: Mar. 19, 2024

(65) Prior Publication Data

US 2024/0217808 A1 Jul. 4, 2024

Related U.S. Application Data

(62) Division of application No. 17/550,607, filed on Dec. 14, 2021, now Pat. No. 11,970,388.

(30) Foreign Application Priority Data

Dec. 14, 2020 (TW) .................................. 109144042

(51) Int. Cl.
*B81C 3/00* (2006.01)
*B81B 3/00* (2006.01)

(52) U.S. Cl.
CPC ............ *B81B 3/0018* (2013.01); *B81C 3/001* (2013.01); *B81B 2201/0214* (2013.01);
(Continued)

(58) Field of Classification Search
CPC ... B81C 3/001; B81C 1/00238; B81B 3/0018; B81B 2201/0214; B81B 2201/03;
(Continued)

(56) References Cited

U.S. PATENT DOCUMENTS

| 6,358,776 B1 | 3/2002 | Takehara et al. |
| 10,056,294 B2 | 8/2018 | Sridharan et al. |

(Continued)

FOREIGN PATENT DOCUMENTS

| CN | 103922273 A | * 7/2014 |
| CN | 106558574 A | 4/2017 |

*Primary Examiner* — Moazzam Hossain
(74) *Attorney, Agent, or Firm* — MUNCY, GEISSLER, OLDS & LOWE, P.C.

(57) ABSTRACT

A method for manufacturing package structure is provided, including: providing a substrate having recesses; forming first MEMS chips on the substrate, each with a through-substrate via, and a first sensor or microactuator on the lower surface, located in one of the recesses; forming first intermediate chips on the substrate, each respectively on one of the first MEMS chips, having a through-substrate via, and including a signal conversion unit, a logic operation unit, control unit, or a combination thereof; forming second MEMS chips on the first intermediate chips, each with a through-substrate via, having a second sensor or microactuator on its upper surface, wherein the package structure includes at least one of the first sensor and the second sensor; and forming first capping plates on the second MEMS chips, each providing a receiving space for the second sensor or microactuator on the upper surface of each second MEMS chip.

18 Claims, 6 Drawing Sheets

(52) U.S. Cl.
CPC ..... *B81B 2201/03* (2013.01); *B81B 2203/033* (2013.01); *B81B 2207/09* (2013.01)

(58) Field of Classification Search
CPC . B81B 2203/033; B81B 2207/09; B81B 7/02; B81B 2207/07
See application file for complete search history.

(56) References Cited

U.S. PATENT DOCUMENTS

| | | |
|---|---|---|
| 2012/0032283 A1 | 2/2012 | Frey et al. |
| 2017/0164107 A1* | 6/2017 | Murgia .................. H04R 3/005 |
| 2018/0095127 A1 | 4/2018 | Pappu et al. |
| 2020/0131027 A1* | 4/2020 | Kang ...................... B81B 7/007 |
| 2021/0060610 A1 | 3/2021 | Chiu et al. |

\* cited by examiner

METHOD FOR MANUFACTURING PACKAGE STRUCTURE

CROSS REFERENCE TO RELATED APPLICATIONS

This application is a divisional application of U.S. application Ser. No. 17/550,607, filed on Dec. 14, 2021, entitled "PACKAGE STRUCTURE AND METHOD FOR MANUFACTURING THE SAME", which claims priority of Taiwan Patent Application No. 109144042, filed on Dec. 14, 2020, the entirety of which is incorporated by reference herein.

BACKGROUND OF THE INVENTION

Field of the Invention

The present invention relates to a method for manufacturing a package structure, and in particular, it relates to a method for manufacturing a package structure with a three-dimensional microelectromechanical system chip stack and a manufacturing method thereof.

Description of the Related Art

The microelectromechanical system (MEMS) is a technology that combines microelectronic technology and mechanical engineering. MEMS technology enables a lot of industrial equipment to be miniaturized. MEMS devices usually include a microprocessor and at least one microsensor for obtaining external information.

For current MEMS devices, it is usually to assemble multiple MEMS elements in the same package structure, and it is necessary to integrate the operations of these MEMS elements. However, if the two MEMS elements are too close, the signals of the two MEMS elements may interfere with each other. As a result, the yield and reliability of the MEMS device will be reduced.

On the other hand, in the package structure of MEMS devices, each MEMS element is usually independent and needs to be controlled by its own control chip. Furthermore, additional controlling units or computing units are usually required to integrate or process signals from different MEMS elements. Therefore, the area of the MEMS device is relatively large, which is disadvantageous to the miniaturization of the package structure.

Therefore, in the technical field, there is still a need for a MEMS device package structure and a manufacturing method thereof with high yield and high reliability.

BRIEF SUMMARY OF THE INVENTION

The embodiments of the present invention provide a package structure and a method for manufacturing a package structure, which can improve the yield and reliability of the MEMS device, and can facilitate the miniaturization of the package structure.

In accordance with some embodiments of the present disclosure, a package structure is provided. The package structure includes a substrate, a first MEMS chip, a first intermediate chip, a second MEMS chip, and a first capping plate. The substrate has a recess. The first MEMS chip is formed on the substrate, and has a through-substrate via. The lower surface of the first MEMS chip has a first sensor or a microactuator, and the first sensor or the microactuator is located in the recess. The first intermediate chip is formed on the first MEMS chip, and has a through-substrate via. The first intermediate chip comprises a signal conversion unit, a logic operation unit, a control unit, or a combination thereof. The second MEMS chip is formed on the first intermediate chip, and has a through-substrate via. The upper surface of the second MEMS chip has a second sensor or a microactuator. The package structure comprises at least one of the first sensor and the second sensor. The first capping plate is formed on the second MEMS chip, and provides a receiving space. The second sensor or the microactuator located on the upper surface of the second MEMS chip is located in the receiving space.

In accordance with some embodiments of the present disclosure, a method for manufacturing a package structure is provided. The method includes providing a substrate, and the substrate has a plurality of recesses. The method includes forming a plurality of first MEMS chips on the substrate, and each first MEMS chip has a through-substrate via. The lower surface of each first MEMS chip has a first sensor or microactuator, and the first sensor or the microactuator is located in one of the recesses. The method includes forming a plurality of first intermediate chips on the substrate, and each first intermediate chip is respectively formed on one of the first MEMS chips. Each first intermediate chip has a through-substrate via, and each first intermediate chip comprises a signal conversion unit, a logic operation unit, a control unit, or a combination thereof. The method includes forming a plurality of second MEMS chips on the first intermediate chips, and each second MEMS chip has a through-substrate via. The upper surface of each second MEMS chip has a second sensor or a microactuator. The package structure comprises the first sensor and/or the second sensor. The method includes forming a plurality of first capping plates on the second MEMS chips, and each first capping plate provides a receiving space. The second sensor or the microactuator located on the upper surface of each second MEMS chip is located in the receiving space.

In the package structure with the MEMS device provided by the embodiments of the present invention, at least one intermediate chip is disposed between two vertically stacked MEMS chips. Because the distance between the two MEMS chips is increased by disposing the intermediate chip, the signal interference between the MEMS chips can be reduced. Therefore, the yield and reliability can be improved, and the miniaturization of the package structure can be facilitated. In addition, in the embodiments of the present invention, more than three MEMS chips with different functions can be integrated in the same package structure without significantly increasing the area of the package structure.

DETAILED DESCRIPTION OF THE INVENTION

The present disclosure is best understood from the following detailed description when read with the accompanying figures. Furthermore, the present disclosure may repeat reference numerals and/or letters in the various examples. This repetition is for the purpose of simplicity and clarity and does not in itself dictate a relationship between the various embodiments and/or configurations discussed.

A package structure and a method for manufacturing such a package structure are provided in the embodiments of the present invention. FIG. 1A to FIG. 1F are cross-sectional views corresponding to various steps of manufacturing a package structure 100 in accordance with some embodiments of the present invention.

Figure 1A:
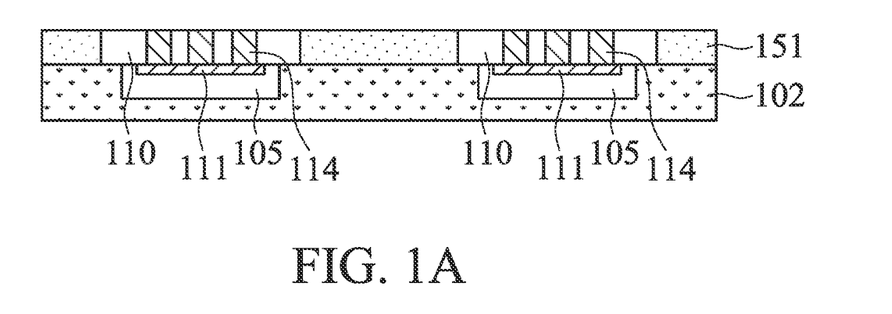
FIG. 1A to FIG. 1F are cross-sectional views corresponding to various steps of manufacturing a package structure in accordance with some embodiments of the present invention.

Referring to FIG. 1A, a substrate 102 having a plurality of recesses 105 is provided. Then, corresponding to the positions of the recesses 105, a plurality of first MEMS chips 110 are formed on the substrate 102. The material of the substrate 102 may include glass, polymer, semiconductor, metal, or a combination thereof. A suitable substrate 102 may be selected according to the function of the first MEMS chip 110. For example, when the first MEMS chip 110 includes an optical sensor, the material of the substrate 102 may be the material with transparency, such as glass or polymer.

The first MEMS chip 110 may be formed by any suitable method. For example, through-holes may be formed in the semiconductor wafer by a lithography process, an etching process, a laser drilling process, a mechanical drilling process, or a combination thereof. Then, a conductive material is filled into the through hole to form a through-substrate via (TSV) 114. For example, the through-substrate via 114 may be a through-silicon via. Then, a first microstructure 111 is formed on one surface of the semiconductor wafer. Then, the semiconductor wafer may be cut to form a plurality of first MEMS chips 110. In some embodiments, the first MEMS chip 110 may be bonded to the substrate 102.

For example, the substrate 102 and the first MEMS chip 110 may be bonded together by an adhesive which is applied to the upper surface of the substrate 102 or the lower surface of the first MEMS chip 110.

As shown in FIG. 1A, the lower surface of the first MEMS chip 110 has a first microstructure 111, and each first MEMS chip 110 has a plurality of through-substrate vias 114 therein. The first microstructure 111 may be a sensor or a microactuator. In one embodiment, the first microstructure 111 is a first sensor, such that the first MEMS chip 110 has a sensing function. In another embodiment, the first microstructure 111 is a microactuator, and the first MEMS chip 110 has functions such as switching, deformation, or movement. In order to simplify the description, the forming method and function of the first microstructure 111 will not be described in detail herein. The conductive material that can be used to form the through-substrate via 114 may include metals (for example, copper, aluminum, silver, gold, tungsten, cobalt, nickel, titanium, or tantalum), alloys, or a combination thereof.

Referring to FIG. 1A, after the substrate 102 and the first MEMS chip 110 are bonded together, a molding compound layer 151 is formed to cover the substrate 102 and the first MEMS chip 110. Then, the molding compound layer 151 is cured. Next, a first planarization process, such as a chemical mechanical polishing (CMP) process, is performed to expose the upper surfaces of the first MEMS chip 110 and the through-substrate via 114. The first planarization process makes the upper surfaces of the first MEMS chip 110, the through-substrate via 114, and the molding compound layer 151 coplanar to facilitate the formation of the subsequent first redistribution layer 161. The molding compound layer 151 can provide a good supporting function and protect the first MEMS chip 110 from damage. The molding compound layer 151 may include a curable resin (for example, polyester resin, vinyl ester resin, or epoxy resin) or a combination thereof. The molding compound layer 151 may be cured by light or heating.

Figure 1B:
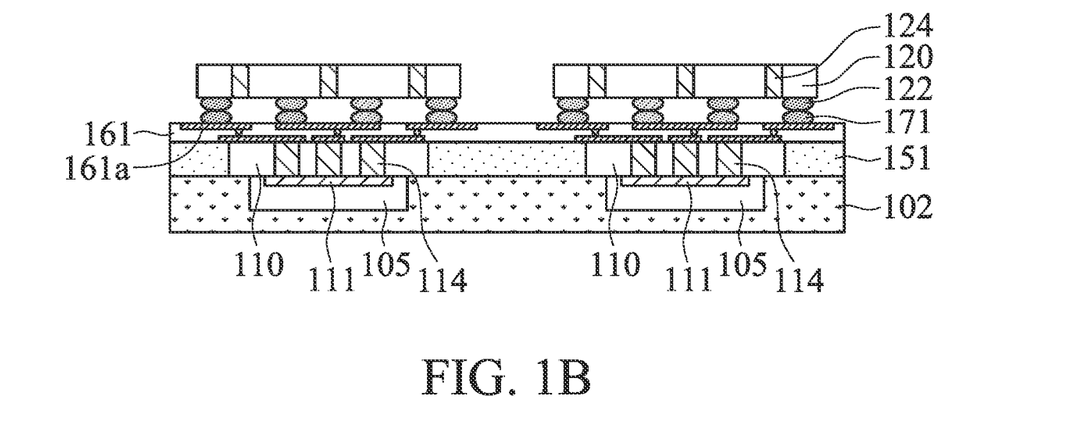

Referring to FIG. 1B, a first redistribution layer 161 is formed on the first MEMS chip 110. Then, a plurality of first intermediate chips 120 are formed on the first redistribution layer 161. The position of the first intermediate chip 120 corresponds to the position of the first MEMS chip 110. The first redistribution layer 161 may include a stacked structure formed by a plurality of insulating layers and a plurality of first conductive elements 161a formed in the stacked structure. In some embodiments, the first redistribution layer 161 may also include electrical connecting elements 171 as needed, so that the first intermediate chip 120 can be electrically connected to the first conductive element 161a. In the present embodiment, the electrical connecting elements 171 are formed on the upper surface of the first redistribution layer 161. In other embodiments, the electrical connecting element 171 is formed in the first redistribution layer 161 and is exposed from the upper surface of the first redistribution layer 161 or partially protrudes from the upper surface of the first redistribution layer 161. The first conductive elements 161a may include conductive lines, conductive vias, or conductive pads. The material of the insulating layer may include resin (for example, polyimide resin or epoxy resin), silicon oxide, silicon nitride, silicon oxynitride, or a combination thereof. The electrical connecting elements 171 may include conductive pillars or conductive solder balls. The material of the first conductive element 161a may include metal (for example, copper, aluminum, silver, gold, tungsten, cobalt, nickel, titanium, or tantalum), alloy, or a combination thereof. The melting point of the electrical connecting element 171 may be lower than the melting point of the first conductive element 161a. The material of the electrical connecting element 171 may include metal (for example, copper, aluminum, silver, gold, tin, or lead), alloy, or a combination thereof.

The first redistribution layer 161 may be formed by repeating a deposition process, a patterning process, and a planarization process several times. For example, an insulating layer may be formed on the molding compound layer 151 and the first MEMS chip 110 by a deposition process. Then, openings or trenches may be formed in the above-mentioned insulating layer by a patterning process. Then, a conductive material may be formed in the above-mentioned openings or trenches by a deposition process. Then, the upper surface of the insulating layer and the upper surface of the conductive material may be made coplanar by a planarization process. The above-mentioned steps are repeated several times, so that the first redistribution layer 161 can be formed. The deposition process may include 3-D printing (laminated manufacturing), physical vapor deposition, chemical vapor deposition, atomic layer deposition, spin coating process, or a combination thereof. The patterning process may include a lithography process, an etching process, laser or mechanical drilling processes, or a combination thereof. The planarization process may include a CMP process, a mechanical polishing process, or a combination thereof.

Referring to FIG. 1B, the first intermediate chip 120 has a plurality of electrical connecting elements 122 and a plurality of through-substrate vias 124. The electrical connecting element 122 is formed on the lower surface of the first intermediate chip 120 and is electrically connected to the electrical connecting element 171. The material and forming method of the electrical connecting element 122 may be the same as or similar to the material and forming method of the electrical connecting element 171. The electrical connecting element 122 can be joined to the electrical connecting element 171 or the first conductive element 161*a* (if the electrical connecting element 171 does not exist) by heating treatment. As a result, the first intermediate chip 120 can be fixed on the first redistribution layer 161.

Figure 1C:
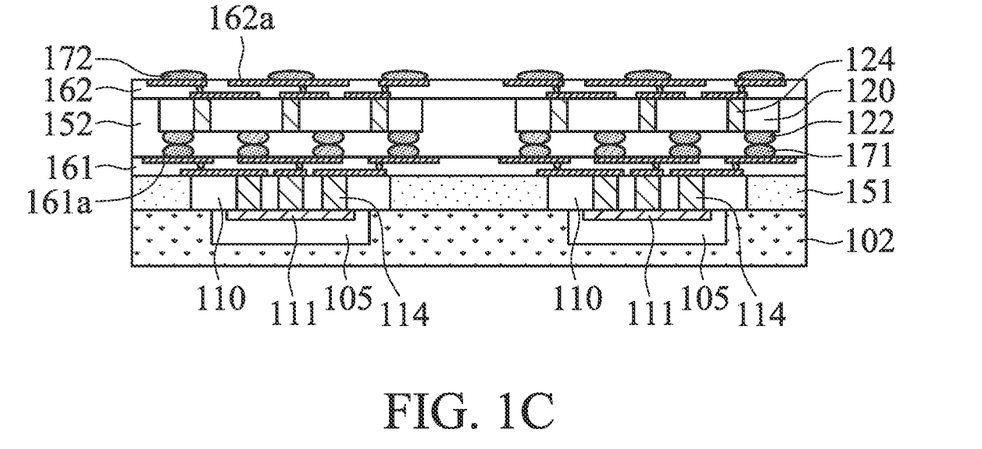

Referring to FIG. 1C, after the first intermediate chip 120 is bonded to the first redistribution layer 161, a molding compound layer 152 is formed to cover the first intermediate chip 120. Then, the molding compound layer 152 is cured. Next, a second planarization process, such as a CMP process, is performed to expose the upper surface of the first intermediate chip 120 and the upper surface of the through-substrate via 124. The second planarization process makes the upper surface of the first intermediate chip 120, the upper surface of the through-substrate via 124, and the upper surface of the molding compound layer 152 coplanar to facilitate the formation of the subsequent second redistribution layer 162.

In one embodiment, the second redistribution layer 162 may be formed on the first intermediate chip 120. The second redistribution layer 162 may include a stacked structure formed by a plurality of insulating layers and a plurality of second conductive elements 162*a* formed in the stacked structure. In some embodiments, the second redistribution layer 162 may also include electrical connecting elements 172 as needed, so that the second conductive elements 162*a* can be electrically connected to the second MEMS chip 130 formed subsequently. The structure, material, and forming method of the second redistribution layer 162 may be the same as or similar to the structure, material, and forming method of the first redistribution layer 161, and will not be described in detail herein.

Figure 1D:
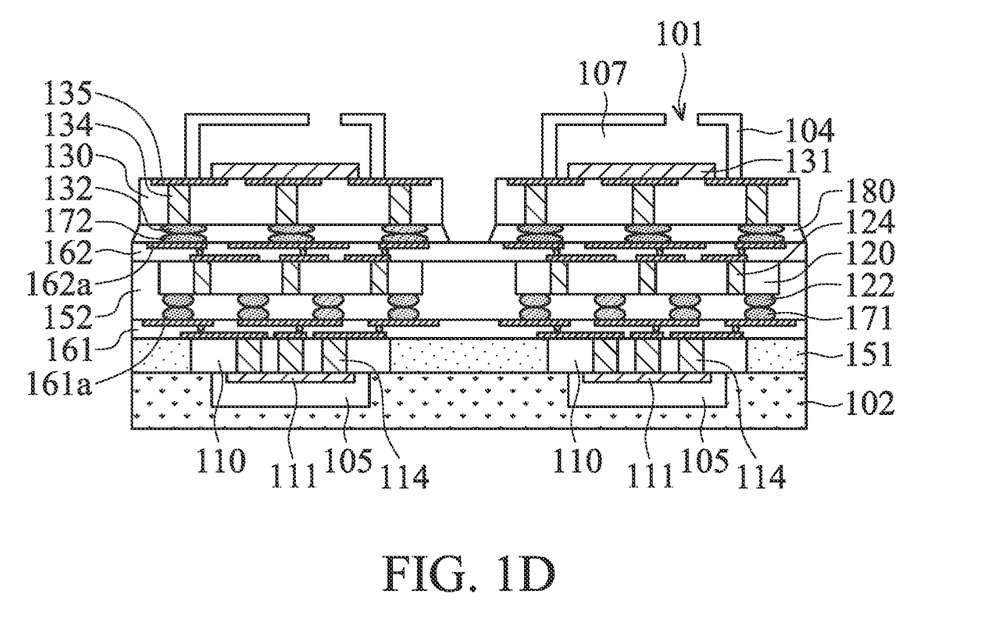

Referring to FIG. 1D, second MEMS chips 130 are formed on the first intermediate chips 120. Then, first capping plates 104 are formed on the second MEMS chips 130. Each first capping plate 104 is used to provide a receiving space 107.

The material of the first capping plate 104 may be the same as or similar to the material of the substrate 102. A suitable first capping plate 104 may be selected according to the function of the second MEMS chip 130. For example, when the second MEMS chip 130 includes a gas sensor, the material of the first capping plate 104 may be the chemically passivated material, such as glass or polymer.

As shown in FIG. 1D, the lower surface of the second MEMS chip 130 has a plurality of electrical connecting elements 132, and each second MEMS chip 130 has a plurality of through-substrate vias 134 therein. The electrical connecting element 132 of the second MEMS chip 130 may be joined to the electrical connecting element 172 or the second conductive element 162*a* (if the electrical connecting element 172 does not exist) by heating treatment. As a result, the second MEMS chip 130 can be fixed on the second redistribution layer 162.

As shown in FIG. 1D, the upper surface of each second MEMS chip 130 has a second microstructure 131 and a plurality of conductive pads 135. The conductive pad 135 may be used to electrically connect with an external circuit. The material and forming method of the conductive pad 135 may be the same as or similar to the material and forming method of the first conductive element 161*a*. The second microstructure 131 may be a sensor or a microactuator. In one embodiment, the second microstructure 131 is a second sensor, and the second MEMS chip 130 has a sensing function. In another embodiment, the second microstructure 131 is a microactuator, and the second MEMS chip 130 has functions such as switching, deformation, or movement.

The forming method of the second MEMS chip 130 may be the same as or similar to the forming method of the first MEMS chip 110. In the present embodiment, the second MEMS chip 130 is fixed on the second redistribution layer 162 first. Then, the first capping plate 104 and the second MEMS chip 130 are bonded together by an adhesive. In other embodiments, the first capping plate 104 and the second MEMS chip 130 are bonded together first, and then, the first capping plate 104 and the second MEMS chip 130 are fixed on the second redistribution layer 162.

Referring to FIG. 1D, after the second MEMS chip 130 is fixed on the second redistribution layer 162, an underfill layer 180 is formed between the second MEMS chip 130 and the second redistribution layer 162. The underfill layer 180 may include a curable resin (for example, epoxy resin). The underfill layer 180 can prevent the second MEMS chip 130 from being displaced or falling off, and can prevent the electrical connecting element 132 and the electrical connecting element 172 from being oxidized.

Figure 1E:
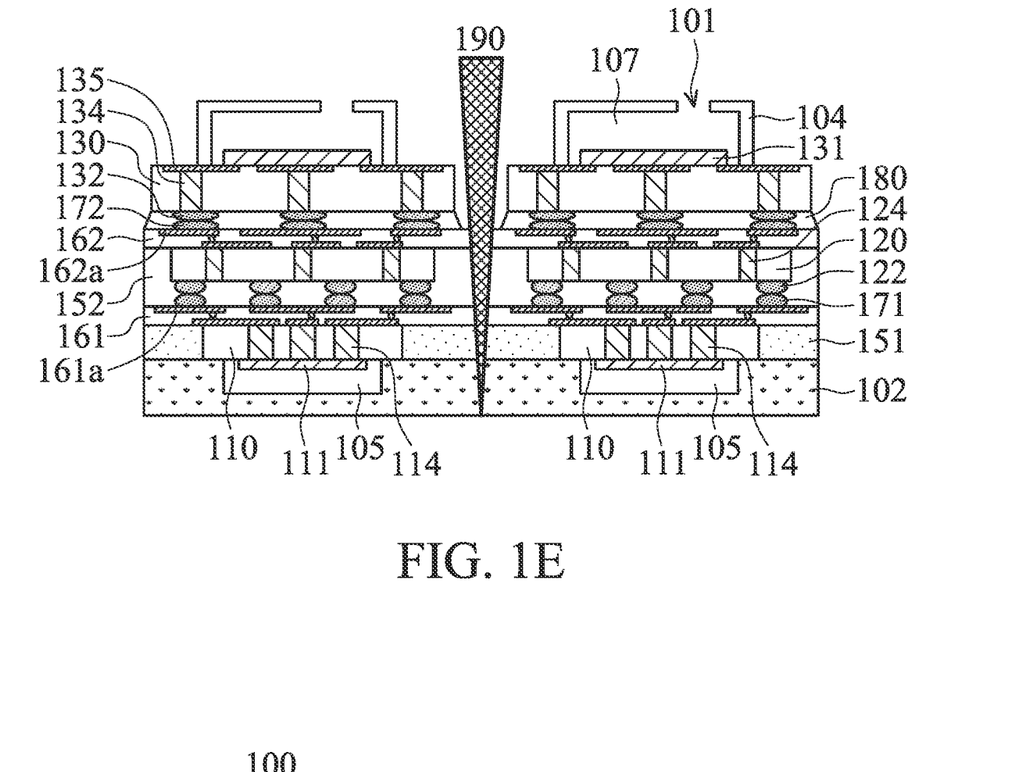

Please refer to FIG. 1E, at a position between two adjacent first capping plates 104, a cutting process 190 is performed on the first redistribution layer 161, the molding compound layer 151, the second redistribution layer 162, the molding compound layer 152, and the substrate 102 to separate the package structures 100 from each other. The cutting process 190 may include a laser cutting process, a diamond cutting process, or a combination thereof.

Figure 1F:
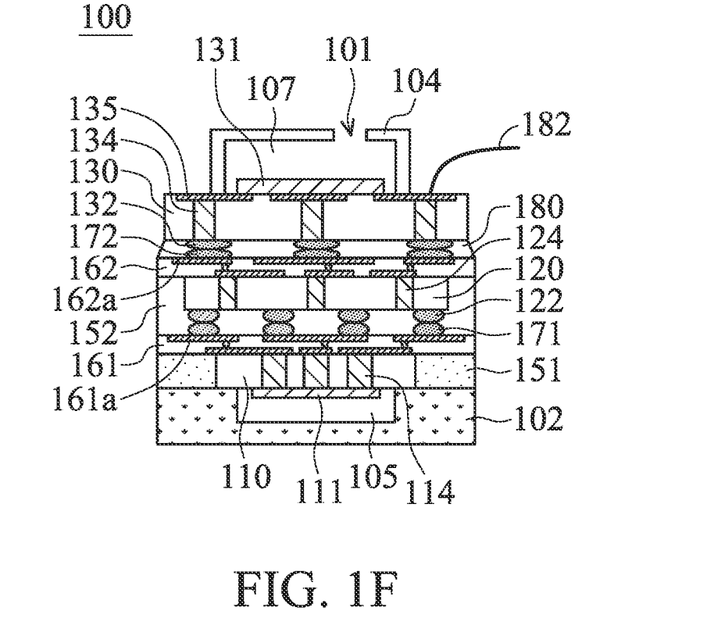

Referring to FIG. 1F, an electrical connecting component 182 is formed to electrically connect the conductive pad 135 and an external circuit. In some embodiments, the electrical connecting component 182 is a conductive circuit, and the electrical connecting component 182 is bonded to the conductive pad 135 exposed outside the first capping plate 104 by a wire bonding process. After the electrical connecting components 182 are formed, other conventional manufacturing processes may be subsequently performed to complete the package structure 100.

In the manufacturing method of the package structure 100 provided in the present embodiment, the substrate 102 with the recess 105 is bonded to the first MEMS chip 110, and a cutting process 190 is used to separate the package structures 100. In other words, in the present embodiment, there is no need to use an additional carrier substrate to temporarily support the MEMS chip as in the conventional technique. Therefore, the subsequent step of removing the carrier substrate can be omitted. Furthermore, in the present embodiment, after the cutting process 190, there is no need to form a capping plate to cover the MEMS chip as in the conventional technique. Therefore, the manufacturing method provided by the present embodiment can simplify the manufacturing process.

The embodiments of the present invention provide a package structure 100. Referring to FIG. 1F, the package structure 100 includes a substrate 102, a first MEMS chip 110, a first redistribution layer 161, a first intermediate chip 120, a second redistribution layer 162, a second MEMS chip 130, and a first capping plate 104 stacked sequentially from bottom to top.

The upper surface of the substrate 102 has a recess 105. The lower surface of the first MEMS chip 110 has a first microstructure 111. The first microstructure 111 is located in the recess 105. The first capping plate 104 covers the second MEMS chip 130 and provides a receiving space 107. The upper surface of the second MEMS chip 130 has a second microstructure 131. The second microstructure 131 is located in the receiving space 107. The first microstructure 111 may be a first sensor or a microactuator, and the second microstructure 131 may be a second sensor or a microactuator. In the present embodiment, at least one of the first microstructure 111 and the second microstructure 131 may be a sensor. In some embodiments, the first microstructure 111 is a first sensor, and the second microstructure 131 is a second sensor. In such an embodiment, the first microstructure 111 and the second microstructure 131 may each independently be a sound sensor, a gas sensor, an optical sensor, a temperature sensor, a chemical substance sensor, or an another sensor. The first intermediate chip 120 is formed between the first MEMS chip 110 and the second MEMS chip 130. The first redistribution layer 161 is formed between the first MEMS chip 110 and the first intermediate chip 120, and the second redistribution layer 162 is formed between the first intermediate chip 120 and the second MEMS chip 130.

In the package structure 100 having vertically stacked MEMS chips provided by the embodiments of the present invention, the first intermediate chip 120 is disposed between the vertically stacked first MEMS chip 110 and the second MEMS chip 130. Compared with horizontally arranging the first MEMS chip 110 and the second MEMS chip 130, the present embodiment can increase the distance between the first MEMS chip 110 and the second MEMS chip 130 and reduce the area of the package structure 100. Therefore, the signal interference between the first MEMS chip 110 and the second MEMS chip 130 can be reduced. As a result, the yield and reliability of the package structure 100 can be improved, and the miniaturization of the package structure 100 can be facilitated.

In the package structure 100 provided by the embodiments of the present invention, the first intermediate chip 120 may include a signal conversion unit, a logic operation unit, a control unit, or a combination thereof. Therefore, the first intermediate chip 120 can receive and process signals from the first MEMS chip 110 and the second MEMS chip 130 at the same time, and can control the operations of the first MEMS chip 110 and the second MEMS chip 130 at the same time. As a result, the performance of the package structure 100 can be improved, and the miniaturization of the package structure 100 can be facilitated.

In the package structure 100 provided by the embodiments of the present invention, the first redistribution layer 161 can be used to transmit signals between the first intermediate chip 120 and the first MEMS chip 110, and the second redistribution layer 162 can be used to transmit signals between the first intermediate chip 120 and the second MEMS chip 130. The first MEMS chip 110, the first intermediate chip 120, and the second MEMS chip 130 may have different sizes. By providing the first redistribution layer 161 and the second redistribution layer 162, the electrical connection between adjacent elements can be facilitated. In other words, the first redistribution layer 161 and the second redistribution layer 162 help to integrate the first MEMS chip 110, the first intermediate chip 120 and the second MEMS chip 130 into the same package structure 100.

In the package structure 100 provided by the embodiments of the present invention, the structure of the recess 105 and the receiving space 107 may be changed according to the function of the first MEMS chip 110 and the function of the second MEMS chip 130. For example, when the recess 105 is a closed space, the first microstructure 111 may be a sound sensor, an optical sensor, a temperature sensor, or an actuator. On the other hand, when the recess 105 is an open space, the first microstructure 111 may be a gas sensor, a chemical substance sensor, or an actuator.

Referring to FIG. 1F, in the present embodiment, the recess 105 is a closed space. The upper surface of the first capping plate 104 has an opening 101, so that the receiving space 107 becomes an open space. In some embodiments, a filling medium may be used to fill the recess 105, so that the performance of the first MEMS chip 110 may be further improved by the filling medium. For example, in some embodiments, the first microstructure 111 is an optical sensor, and a filling medium with light absorption characteristics is used to fill the recess 105. The filling medium can allow the light in the desired wavelength range to pass through, and can block the light in other wavelength ranges. Therefore, the sensing sensitivity can be improved. In addition, in other embodiments, the filling medium can be used to adjust the refractive index, color, or sound absorption characteristics in the recess 105. The filling medium may include curable polymers, pigments, dyes, solvents, high-viscosity liquid materials, or a combination thereof.

It should be understood that the structure of the recess 105 and the receiving space 107 may be determined according to needs. For example, the recess 105 and the receiving space 107 can each independently be a closed space or an open space. The filling medium may be formed in the closed recess 105 and/or the receiving space 107 as needed.

Figure 2:
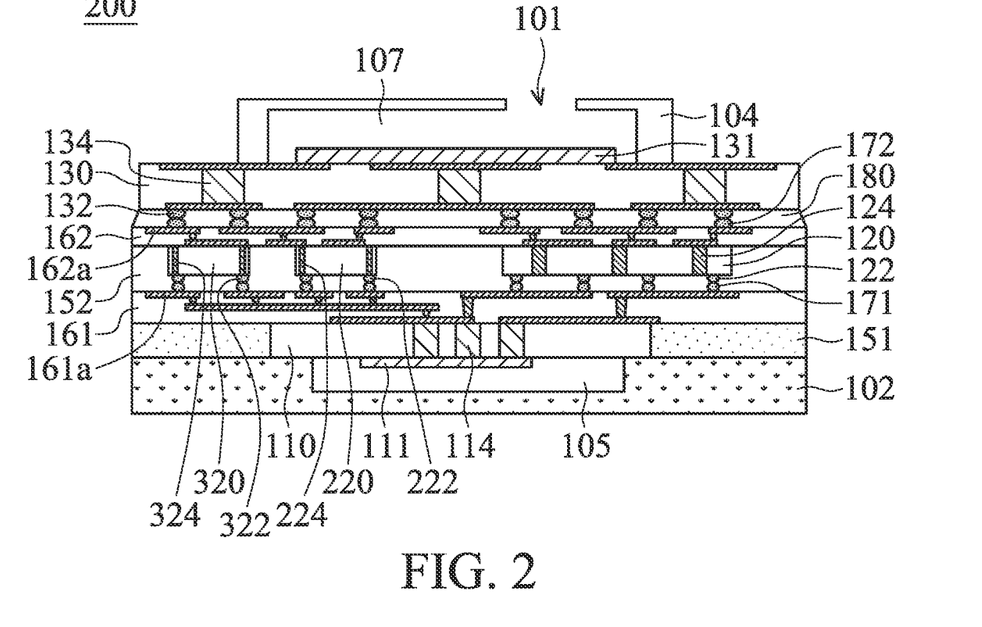
FIG. 2 is a cross-sectional view of a package structure in accordance with other embodiments of the present invention.

FIG. 2 is similar to FIG. 1F. In FIG. 2, the same reference numerals are used to denote the same elements as those shown in FIG. 1F. In order to simplify the description, the elements that are the same as those shown in FIG. 1F and the forming process steps thereof will not be described in detail here.

The package structure 200 shown in FIG. 2 is similar to the package structure 100 shown in FIG. 1F, and the difference is that the package structure 200 has a second intermediate chip 220 and a third intermediate chip 320. The first intermediate chip 120, the second intermediate chip 220, and the third intermediate chip 320 may be formed on the first redistribution layer 161 in the process step corresponding to FIG. 1B. In other words, in the present embodiment, the first intermediate chip 120, the second intermediate chip 220, and the third intermediate chip 320 are arranged horizontally.

The structure of the second intermediate chip 220 and the structure of the third intermediate chip 320 may be similar to the structure of the first intermediate chip 120. The second intermediate chip 220 has a plurality of electrical connecting elements 222 and a plurality of through-substrate vias 224. The third intermediate chip 320 has a plurality of electrical connecting elements 322 and a plurality of through-substrate vias 324. The second intermediate chip 220 may include a memory unit, an antenna unit, or a combination thereof. The third intermediate chip 320 may include a memory unit, an antenna unit, or a combination thereof. In some embodiments, one of the second intermediate chip 220 and the third intermediate chip 320 has a memory unit, and the other has an antenna unit. The memory unit can store signals from the first MEMS chip 110 and/or the second MEMS chip 130. The antenna unit can receive signals from the outside or send signals to the outside. Therefore, the packaging structure 200 can be operated remotely.

In the present embodiment, the size of the second intermediate chip 220 and the size of the third intermediate chip 320 are smaller to the size of the first intermediate chip 120. Furthermore, the size of the second MEMS chip 130 is larger than the sum of the size of the first intermediate chip 120, the size of the second intermediate chip 220, and the size of the third intermediate chip 320. Therefore, even if the second intermediate chip 220 and the third intermediate chip 320 are integrated into the package structure 200, the volume of the package structure 200 will not increase. Integrating the second intermediate chip 220 and the third intermediate chip 320 can increase the functions and application fields of the package structure 200.

Figure 3:
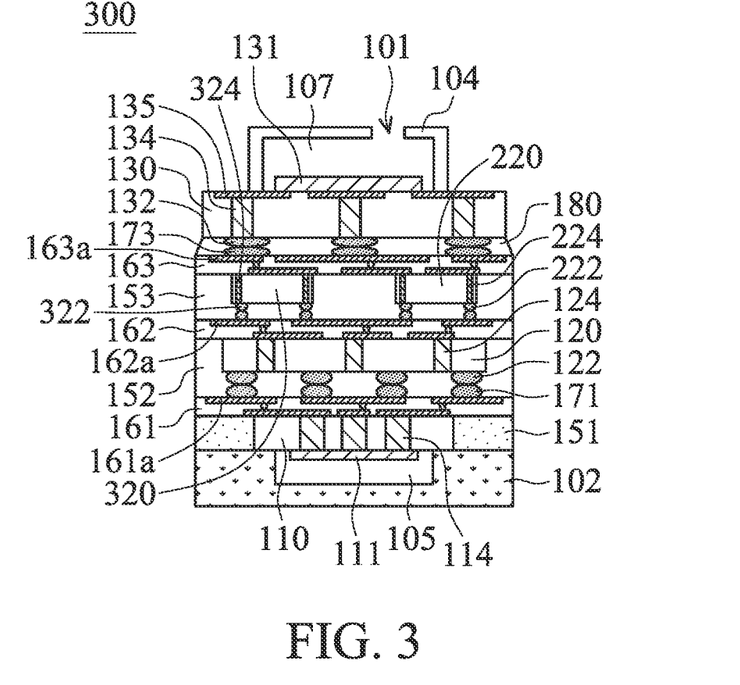
FIG. 3 is a cross-sectional view of a package structure in accordance with other embodiments of the present invention.

FIG. 3 is similar to FIG. 2. In FIG. 3, the same reference numerals are used to denote the same elements as those shown in FIG. 2. In order to simplify the description, the elements that are the same as those shown in FIG. 2 and the forming process steps thereof will not be described in detail here.

The package structure 300 shown in FIG. 3 is similar to the package structure 200 shown in FIG. 2, and the difference is that the second intermediate chip 220 and the third intermediate chip 320 are formed between the second MEMS chip 130 and the first intermediate chip 120. The second intermediate chip 220 and the third intermediate chip 320 may be respectively formed on the second redistribution layer 162 in the process step corresponding to FIG. 1C. Then, a molding compound layer 153 is formed to cover the second intermediate chip 220 and the third intermediate chip 320. Then, the molding compound layer 153 is cured. Next, a third planarization process is performed to expose the upper surface of the second intermediate chip 220, the upper surface of the third intermediate chip 320, and the upper surfaces of the through-substrate vias 224, and the upper surfaces of the through-substrate vias 324. Therefore, the upper surface of the second intermediate chip 220, the upper surface of the third intermediate chip 320, the upper surfaces of the through-substrate vias 224, the upper surfaces of the through-substrate vias 324, and the upper surface of the molding compound layer 153 are coplanar to facilitate the formation of the subsequent third redistribution layer 163. Then, the third redistribution layer 163 may be formed on the second intermediate chip 220 and the third intermediate chip 320, and the second MEMS chip 130 may be formed on the third redistribution layer 163. In other words, in the present embodiment, the second intermediate chip 220 and the third intermediate chip 320 are arranged horizontally, and the second intermediate chip 220 (and the third intermediate chip 320) and the first intermediate chip 120 are arranged vertically. The third redistribution layer 163 may include a stacked structure formed by a plurality of insulating layers and a plurality of third conductive elements 163*a* formed in the stacked structure. In some embodiments, the third redistribution layer 163 may also include electrical connecting elements 173 as needed, so that the third conductive element 163*a* can be electrically connected to the second MEMS chip 130.

In the present embodiment, the distance between the first MEMS chip 110 and the second MEMS chip 130 can be further increased. Therefore, the signal interference between the first MEMS chip 110 and the second MEMS chip 130 can be further reduced. As a result, the yield and reliability of the package structure 300 can be further improved.

Figure 4:
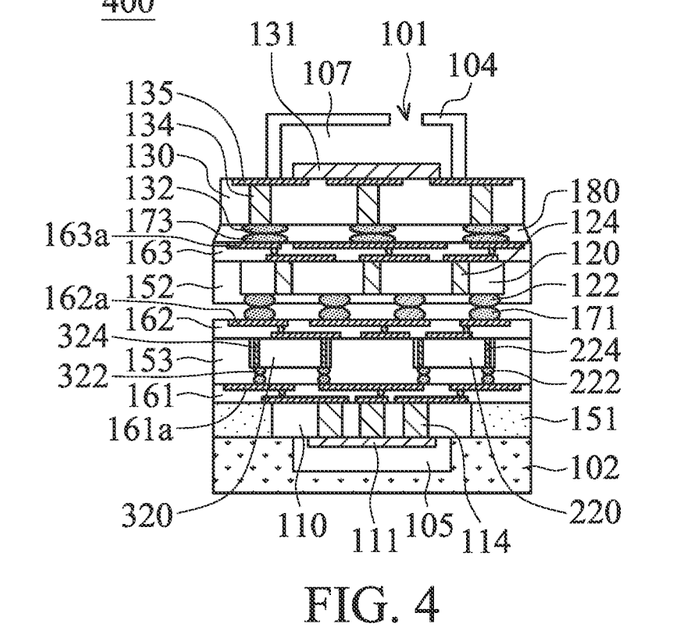
FIG. 4 is a cross-sectional view of a package structure in accordance with other embodiments of the present invention.

FIG. 4 is similar to FIG. 3. In FIG. 4, the same reference numerals are used to denote the same elements as those shown in FIG. 3. In order to simplify the description, the elements that are the same as those shown in FIG. 3 and the forming process steps thereof will not be described in detail here.

The package structure 400 shown in FIG. 4 is similar to the package structure 300 shown in FIG. 3, and the difference is that the second intermediate chip 220 and the third intermediate chip 320 are formed between the first MEMS chip 110 and the first intermediate chip 120. The second intermediate chip 220 and the third intermediate chip 320 may be respectively formed on the first redistribution layer 161 in the process step corresponding to FIG. 1B. Then, the second redistribution layer 162 may be formed on the second intermediate chip 220 and the third intermediate chip 320, and the first intermediate chip 120 may be formed on the second redistribution layer 162. Next, a third redistribution layer 163 may be formed on the first intermediate chip 120, and a second MEMS chip 130 may be formed on the third redistribution layer 163.

Similar to the embodiment shown in FIG. 3, in the present embodiment, the distance between the first MEMS chip 110 and the second MEMS chip 130 can be further increased. Therefore, the signal interference between the first MEMS chip 110 and the second MEMS chip 130 can be further reduced.

It should be understood that the embodiments shown in FIG. 2 to FIG. 4 are merely for the purpose of illustration, and are not intended to limit the present invention. The number, function and arrangement of intermediate chips may be determined according to needs.

Figure 5:
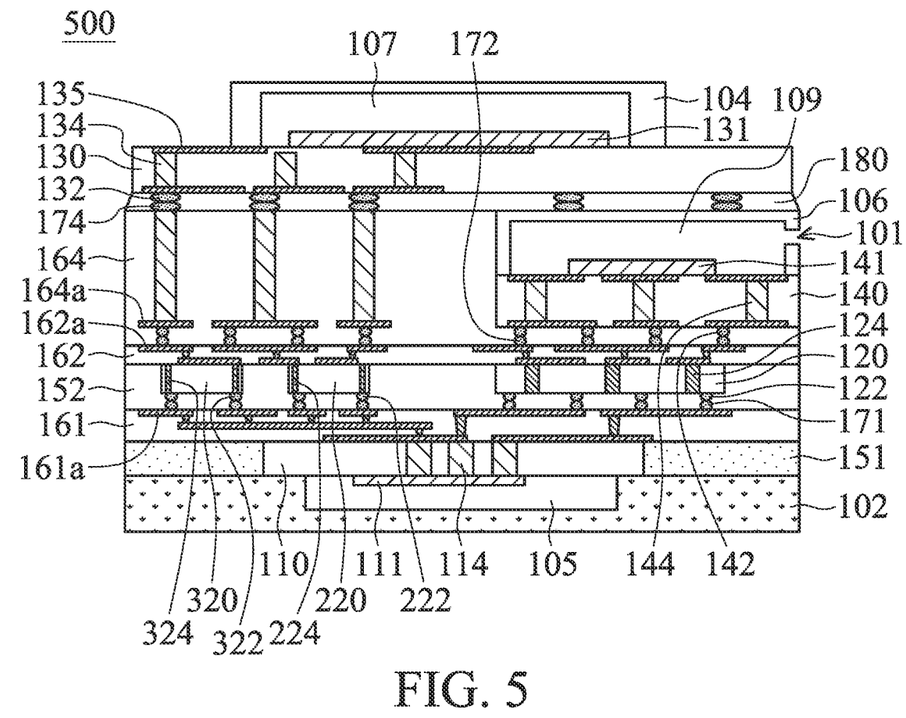
FIG. 5 is a cross-sectional view of a package structure in accordance with other embodiments of the present invention.

FIG. 5 is similar to FIG. 2. In FIG. 5, the same reference numerals are used to denote the same elements as those shown in FIG. 2. In order to simplify the description, the elements that are the same as those shown in FIG. 2 and the forming process steps thereof will not be described in detail here.

The package structure 500 shown in FIG. 5 is similar to the package structure 200 shown in FIG. 2, and the difference is that the package structure 500 further has a third MEMS chip 140. The third MEMS chip 140 is formed between the first intermediate chip 120 and the second MEMS chip 130. After the process step corresponding to FIG. 1C, the fourth redistribution layer 164 is formed on the second redistribution layer 162, and a plurality of openings exposing the second redistribution layer 162 are formed in the fourth redistribution layer 164. Then, corresponding to the positions of these openings, a plurality of third MEMS chips 140 are formed on the second redistribution layer 162. Then, the second MEMS chip 130 may be formed on the fourth redistribution layer 164.

The fourth redistribution layer 164 may include a stacked structure formed by a plurality of insulating layers and a plurality of fourth conductive elements 164*a* formed in the stacked structure. In some embodiments, the fourth redistribution layer 164 may also include electrical connecting elements 174 as needed, so that the fourth conductive element 164*a* can be electrically connected to the second MEMS chip 130.

Referring to FIG. 5, a second capping plate 106 is formed on the third MEMS chip 140. The second capping plate 106 provides a receiving space 109, and a third microstructure 141 of the third MEMS chip 140 is located in the receiving space 109. A suitable second capping plate 106 may be selected according to the function of the third MEMS chip 140. In the present embodiment, after the second capping plate 106 and the third MEMS chip 140 are bonded together, the second capping plate 106 and the third MEMS chip 140 are fixed on the second redistribution layer 162. In other implementations, the third MEMS chip 140 is fixed on the second redistribution layer 162 first. After that, the second capping plate 106 and the third MEMS chip 140 are bonded together by an adhesive which is applied to the upper surface of the third MEMS chip 140 or the lower surface of the second capping plate 106.

As shown in FIG. 5, the lower surface of each of the third MEMS chip 140 has a plurality of electrical connecting elements 142, and each third MEMS chip 140 has a plurality of through-substrate vias 144 therein. The electrical connecting element 142 of the third MEMS chip 140 may be joined to the electrical connecting element 172 or the second conductive element 162a (if the electrical connecting element 172 does not exist) by heating treatment. As a result, the third MEMS chip 140 can be fixed on the second redistribution layer 162. The upper surface of each third MEMS chip 140 has a third microstructure 141. The third microstructure 141 may be a sensor or a microactuator. In one embodiment, the third microstructure 141 is a third sensor, and the third MEMS chip 140 has a sensing function. In another embodiment, the third microstructure 141 is a microactuator, and the third MEMS chip 140 has functions such as switching, deformation, or movement.

In the present embodiment, the sidewall of the second capping plate 106 has an opening 101, so that the receiving space 109 is an open space. In other embodiments, the receiving space 109 is a closed space and may be filled with a filling medium. It should be noted that, in the present embodiment, when the receiving space 109 is an open space, in order to reduce or avoid the influence of subsequent manufacturing processes on the third microstructure 141, the opening 101 is located on the sidewall of the second capping plate 106.

Figure 6:
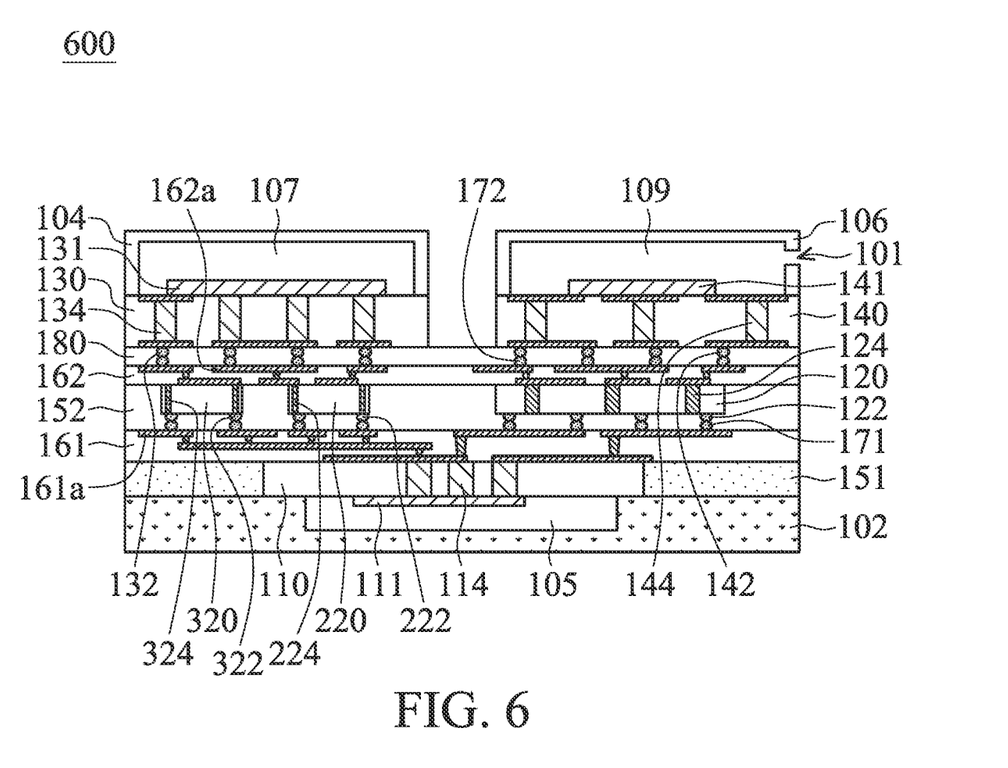
FIG. 6 is a cross-sectional view of a package structure in accordance with other embodiments of the present invention.

FIG. 6 is similar to FIG. 5. In FIG. 6, the same reference numerals are used to denote the same elements as those shown in FIG. 5. In order to simplify the description, the elements that are the same as those shown in FIG. 5 and the forming process steps thereof will not be described in detail here. The package structure 600 shown in FIG. 6 is similar to the package structure 500 shown in FIG. 5, and the difference is that the third MEMS chip 140 is formed on the first intermediate chip 120 and is arranged horizontally with the second MEMS chip 130. The second MEMS chip 130 and the third MEMS chip 140 may be respectively formed on the second redistribution layer 162 in the process step corresponding to FIG. 1D.

In the embodiments shown in FIG. 5 and FIG. 6, more than three MEMS chips with different functions can be integrated in the same package structure without significantly increasing the area. Therefore, the application fields can be increased under the premise of meeting the miniaturization of the package structure. In addition, the number, functions, and arrangement of MEMS chips may be determined according to needs.

The various packaging structures with MEMS devices provided by the embodiments of the present invention can be widely used in various fields. In some embodiments, the packaging structure 100 shown in FIG. 1F may be a biomedical detecting device. The first MEMS chip 110 may be a micro motor, and the second MEMS chip 130 may be a sensor of chemical substances (for example, hemoglobin, specific protein or hormone, etc.). In such an embodiment, the packaging structure 100 can move in a living body and detect specific chemical substances. In other embodiments, any one of the packaging structures 200, 300, and 400 may be another type of biomedical detecting device. The second intermediate chip 220 may have a memory unit, and the third intermediate chip 320 may have an antenna unit. Any one of the packaging structures 200, 300, and 400 can store the sensing data of a specific chemical substance and can be operated remotely or send the sensing data to outside the living body. In other embodiments, any one of the packaging structures 500 and 600 may be another type of biomedical detecting device. The third MEMS chip 140 may be a sensor of the second chemical substance (for example, hemoglobin, specific protein or hormone, etc.). In such an embodiment, any one of the packaging structures 500 and 600 can simultaneously detect two specific chemical substances.

In some embodiments, the packaging structure 100 as shown in FIG. 1F may be a breathing regulating device. The first MEMS chip 110 may be a microactuator, and the second MEMS chip 130 may be a sensor of gas (for example, oxygen or carbon dioxide, etc.). In such an embodiment, the packaging structure 100 can adjust the supplied oxygen concentration by detecting the breathed gas concentration data of the patient. In other embodiments, any one of the packaging structures 200, 300, and 400 may be another type of breathing regulation device. The second intermediate chip 220 may have a memory unit, and the third intermediate chip 320 may have an antenna unit. Any one of the packaging structures 200, 300, and 400 can store sensing data of a specific gas, and can send signals to remotely control another gas supply device or send sensing data to other devices. In other embodiments, any one of the packaging structures 500 and 600 may be another type of breathing regulation device. The third MEMS chip 140 may be a sound sensor. In such an embodiment, any one of the packaging structures 500 and 600 can simultaneously detect the gas concentration and the sound of the patient's chest cavity to adjust the supplied oxygen concentration.

It should be understood that the above-mentioned embodiments are merely for the purpose of illustration, and are not intended to limit the present invention. The function and combination of the MEMS chip may be determined according to actual needs or application fields.

In summary, in the package structure with MEMS device provided by the embodiment of the present invention, at least one intermediate chip is disposed between two vertically stacked MEMS chips. Because the distance between the two MEMS chips is increased by disposing the intermediate chip, the signal interference between the MEMS chips can be reduced. Therefore, the yield and reliability can be improved. Furthermore, the intermediate chip can simultaneously receive and process signals from the upper MEMS chip and the lower MEMS chip, and can also control the operation of these MEMS chips. Therefore, the miniaturization of the package structure can be facilitated. In addition, in the package structure with MEMS device provided by the embodiment of the present invention, more than three MEMS chips with different functions may be integrated in the same package structure without significantly increasing the area of the package structure. Therefore, the application fields of the package structure with the MEMS device can be greatly increased under the premise of meeting the miniaturization of the package structure.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A method for manufacturing a package structure, comprising:
   providing a substrate, wherein the substrate has a plurality of recesses;
   forming a plurality of first MEMS chips on the substrate, wherein each of the first MEMS chips has a through-substrate via, a lower surface of each of the first MEMS chips has a first sensor or microactuator formed on the through-substrate via, and the first sensor or the microactuator is located in one of the recesses;
   forming a plurality of first intermediate chips on the substrate, wherein each of the first intermediate chips is respectively formed on one of the first MEMS chips, wherein each of the first intermediate chips has a through-substrate via, and wherein each of the first intermediate chips comprises a signal conversion unit, a logic operation unit, a control unit, or a combination thereof;
   forming a plurality of second MEMS chips on the first intermediate chips, wherein each of the second MEMS chips has a through-substrate via, wherein an upper surface of each of the second MEMS chips has a second sensor or a microactuator formed on the through-substrate via, and wherein the package structure comprises at least one of the first sensor and the second sensor; and
   forming a plurality of first capping plates on the second MEMS chips, wherein each of the first capping plates provides a receiving space, and wherein the second sensor or the microactuator located on the upper surface of each of the second MEMS chips is located in the receiving space.

2. The method for manufacturing the package structure as claimed in claim 1, further comprising:
   forming a first molding compound layer to cover the first MEMS chips;
   performing a first planarization process to expose upper surfaces of the first MEMS chips, so that the upper surfaces of the first MEMS chips and an upper surface of the first molding compound layer are coplanar;
   forming a first redistribution layer on the first MEMS chip;
   forming a second molding compound layer to cover the first intermediate chips;
   performing a second planarization process to expose upper surfaces of the first intermediate chips, so that the upper surfaces of the first intermediate chips and an upper surface of the second molding compound layer are coplanar;
   forming a second redistribution layer on the first intermediate chip; and
   performing a cutting process on the first redistribution layer, the first molding compound layer, the second redistribution layer, the second molding compound layer, and the substrate.

3. The method for manufacturing the package structure as claimed in claim 2, further comprising:
   curing the second molding compound layer after forming the second molding compound layer to cover the first intermediate chips.

4. The method for manufacturing the package structure as claimed in claim 1, further comprising:
   forming a second intermediate chip between the first MEMS chip and the second MEMS chip, wherein the second intermediate chip has a through-substrate via, and the second intermediate chip comprises a memory unit, an antenna unit, or a combination thereof.

5. The method for manufacturing the package structure as claimed in claim 4, further comprising:
   forming a third intermediate chip between the first MEMS chip and the second MEMS chip, wherein the third intermediate chip has a through-substrate via, and the third intermediate chip comprises a memory unit, an antenna unit, or a combination thereof.

6. The method for manufacturing the package structure as claimed in claim 5, wherein a size of the third intermediate chip is smaller than a size of the first intermediate chip.

7. The method for manufacturing the package structure as claimed in claim 5, wherein a size of the second MEMS chip is larger than a sum of the size of the first intermediate chip, the size of the second intermediate chip, and the size of the third intermediate chip.

8. The method for manufacturing the package structure as claimed in claim 1, further comprising:
   forming a third MEMS chip on the first intermediate chip and arranged horizontally with the second MEMS chip, wherein an upper surface of the third MEMS chip has a third sensor or a microactuator; and
   forming a second capping plate on the third MEMS chip, wherein the third sensor or the microactuator located on the upper surface of the third MEMS chip is located in a receiving space provided by the second capping plate.

9. The method for manufacturing the package structure as claimed in claim 1, further comprising:
   forming a third MEMS chip between the first intermediate chip and the second MEMS chip, wherein an upper surface of the third MEMS chip has a third sensor or a microactuator; and
   forming a second capping plate on the third MEMS chip, wherein the third sensor or the microactuator located on the upper surface of the third MEMS chip is located in a receiving space provided by the second capping plate.

10. The method for manufacturing the package structure as claimed in claim 9, wherein a sidewall of the second capping plate has an opening.

11. The method for manufacturing the package structure as claimed in claim 1, further comprising:
    forming a first redistribution layer between the first MEMS chip and the first intermediate chip;
    forming a second redistribution layer between the first intermediate chip and the second MEMS chip; and
    forming a filling medium in at least one of the recess and the receiving space.

12. The method for manufacturing the package structure as claimed in claim 11, wherein the first redistribution layer comprises an electrical connecting element formed therein, and the electrical connecting element is exposed from an upper surface of the first redistribution layer.

13. The method for manufacturing the package structure as claimed in claim 11, wherein the first redistribution layer comprises an electrical connecting element formed therein, and the electrical connecting element partially protrudes from an upper surface of the first redistribution layer.

14. The method for manufacturing the package structure as claimed in claim 1, wherein the upper surface of the first capping plate has an opening, so that the receiving space becomes an open space.

15. The method for manufacturing the package structure as claimed in claim 1, wherein a size of the second intermediate chip is smaller than a size of the first intermediate chip.

16. The method for manufacturing the package structure as claimed in claim 1, wherein the recess is a closed space, and a filling medium is formed in the recess.

17. The method for manufacturing the package structure as claimed in claim 1, wherein a bottom surface of the first sensor is lower than the top surface of the first MEMS chip.

18. The method for manufacturing the package structure as claimed in claim 17, wherein an upper surface of the second sensor is higher than the top surface of the second MEMS chip.

* * * * *